US010838525B2

(12) United States Patent
Chu et al.

(10) Patent No.: US 10,838,525 B2
(45) Date of Patent: *Nov. 17, 2020

(54) CONTROL KNOB FOR CONTROLLING OPERATION OF A MACHINE

(71) Applicants: DEFOND ELECTECH CO., LTD, Guangdong (CN); DEFOND COMPONENTS LIMITED, Chai Wan (HK)

(72) Inventors: Wai Cheong Wilson Chu, Chai Wan (HK); Tak Chuen Richard Or, Chai Wan (HK)

(73) Assignees: Defond Components Limited, Chai Wan (HK); Defond Electech Co., Ltd., Chai Wan (HK)

( * ) Notice: Subject to any disclaimer, the term of this patent is extended or adjusted under 35 U.S.C. 154(b) by 0 days.

This patent is subject to a terminal disclaimer.

(21) Appl. No.: 16/712,419

(22) Filed: Dec. 12, 2019

(65) Prior Publication Data

US 2020/0192494 A1 Jun. 18, 2020

(30) Foreign Application Priority Data

Dec. 14, 2018 (HK) .................................. 18116101

(51) Int. Cl.
*G06F 3/0362* (2013.01)
*G06F 3/041* (2006.01)

(52) U.S. Cl.
CPC ............ *G06F 3/0362* (2013.01); *G06F 3/041* (2013.01)

(58) Field of Classification Search
CPC ...... G06F 3/0338; G06F 3/0362; G06F 3/044; G06F 3/0482; H01H 19/14
See application file for complete search history.

(56) References Cited

U.S. PATENT DOCUMENTS 4,131,033 A 12/1978 Wright
4,173,941 A 11/1979 Castagna
(Continued)

FOREIGN PATENT DOCUMENTS

CN 102202928 A 9/2011
CN 202217631 U 5/2012
(Continued)

OTHER PUBLICATIONS

Chinese Patent Office Patentability Search Report based on the claims of the priority application HK 16114084.0, dated Dec. 15, 2016, 7 pages.
(Continued)

*Primary Examiner* — Nelson M Rosario
(74) *Attorney, Agent, or Firm* — Ohlandt, Greeley, Ruggiero & Perle, L.L.P.

(57) ABSTRACT

A control knob for operating a machine including: a member for attaching the knob to the machine, a display member including an electronic display module, an operational mode display controller for controlling display of operational modes upon the display module and configured for rotational movement around the display module amongst rotational positions. The display controller operably connected with the display module such that, responsive to the rotational movement of the display controller amongst the rotational positions, the display module is configured to display operational modes of the machine corresponding to the rotational positions. The control knob including an operational mode selector for selection of one of the operational modes of the machine when the one operational mode is displayed on the display module. The operational mode selector configured for movement between a first position and a second position to actuate selection of the operational mode displayed on the display module.

15 Claims, 8 Drawing Sheets

(56) References Cited

U.S. PATENT DOCUMENTS

| | | |
|---|---|---|
| 4,467,961 A | 8/1984 | Coffee |
| 4,553,702 A | 11/1985 | Coffee |
| 4,580,721 A | 4/1986 | Coffee |
| 6,154,201 A | 11/2000 | Levin |
| 6,438,241 B1 | 8/2002 | Silfvast |
| 6,577,120 B2 | 6/2003 | Domkes |
| 6,636,197 B1 | 10/2003 | Goldenberg et al. |
| 8,958,765 B2 | 2/2015 | Jarvinen et al. |
| 2001/0053944 A1 | 12/2001 | Marks |
| 2002/0171627 A1 | 11/2002 | Noguchi |
| 2004/0119683 A1 | 6/2004 | Warn |
| 2004/0262410 A1 | 12/2004 | Hull |
| 2005/0018172 A1 | 1/2005 | Gelfond |
| 2005/0115816 A1 | 6/2005 | Gelfond |
| 2006/0012584 A1 | 1/2006 | Vassallo |
| 2007/0152988 A1 | 7/2007 | Levin |
| 2007/0237136 A1 | 10/2007 | Sako |
| 2007/0266344 A1 | 11/2007 | Olcott |
| 2008/0033256 A1 | 2/2008 | Farhan |
| 2008/0055241 A1 | 3/2008 | Goldenberg |
| 2008/0129707 A1 | 6/2008 | Pryor |
| 2008/0238879 A1 | 10/2008 | Jaeger |
| 2009/0079712 A1 | 3/2009 | Levin |
| 2010/0089564 A1 | 4/2010 | Nomura |
| 2012/0001773 A1 | 1/2012 | Lyons |
| 2012/0130547 A1 | 5/2012 | Fadell |
| 2013/0099124 A1 | 4/2013 | Filson |
| 2013/0292481 A1 | 11/2013 | Filson |
| 2014/0139422 A1 | 5/2014 | Mistry |
| 2014/0139541 A1 | 5/2014 | Willaert |
| 2015/0253942 A1 | 9/2015 | Kurokawa et al. |
| 2015/0282257 A1 | 10/2015 | Hoare |
| 2016/0196103 A1 | 7/2016 | Tang |
| 2016/0378131 A1 | 12/2016 | Battlogg |
| 2016/0378322 A1 | 12/2016 | Klicpera |
| 2017/0045958 A1 | 2/2017 | Battlogg |
| 2018/0298959 A1 | 10/2018 | Battlogg |
| 2018/0373350 A1 | 12/2018 | Rao |
| 2019/0302904 A1* | 10/2019 | Nieh .................. G06F 3/044 |

FOREIGN PATENT DOCUMENTS

| | | |
|---|---|---|
| CN | 104170263 A | 11/2014 |
| CN | 205265141 U | 5/2016 |
| CN | 207529869 U | 6/2018 |
| CN | 207727303 U | 8/2018 |
| CN | 207992863 U | 10/2018 |
| JP | 2012208821 A | 10/2012 |
| WO | 2017/087872 A1 | 5/2017 |

OTHER PUBLICATIONS

Hong Kong Office Action dated Jan. 8, 2019 from corresponding HK Patent Application No. 16114084.0, 7 pages.

* cited by examiner

CONTROL KNOB FOR CONTROLLING OPERATION OF A MACHINE

CROSS REFERENCE TO RELATED APPLICATIONS

This application claims the benefit under 35 U.S.C. § 119(a) of Hong Kong Short Term Patent Application No. 18116101.2 filed Dec. 14, 2018 the contents of which are incorporated by reference herein in their entirety.

BACKGROUND OF THE DISCLOSURE

1. Field of the Disclosure

The present disclosure relates to the field of control knobs and control buttons for controlling operation of machines.

2. Description of the Related Art

Control panels of machines such as electrical home appliances (e.g. microwave ovens, washings machines, dryers) and motor vehicles typically include multiple control knobs (control buttons and the like) to control various operational modes of such machines. A transducer will typically sense the different rotational positions of a control knob and then output electrical control signals that are indicative of the sensed rotational positions (and hence the desired operational modes of the machine as selected by the user). For instance, multiple control knobs may be disposed on a control panel of a microwave oven to control such operational modes as the heating time, heating temperature, and defrosting time. Alternately, a control panel in a motor vehicle may for instance comprise multiple control knobs for operating the air-conditioning, the radio, and the sunroof. Furthermore, an electronic display may typically be disposed on the control panel next to the control knobs to visually display the selected operational modes of the machine that have been selected by the user. However, as the space that is available on the control panels of such machines is finite (and even more so in the context of machines with compact design aesthetics), there is a perceived need for control knobs which improve efficiency in the utilisation of control panel space on such machines without unduly compromising ease and speed of operation.

SUMMARY OF THE DISCLOSURE

The present disclosure seeks to alleviate at least one of the above-described problems.

The present disclosure may involve several broad forms. Embodiments of the present disclosure may include one or any combination of the different broad forms herein described.

In one broad form, the present disclosure provides a control knob for controlling operation of a machine, the control knob including: an attachment member configured for attaching the control knob to a surface of the machine so that the control knob is operably connectable with the machine to control operation thereof; a display member comprising an electronic display module disposed thereon; an operational mode display controller for controlling display of operational modes of the machine upon the electronic display module, said operational mode display controller being configured for rotational movement around the electronic display module amongst a plurality of rotational positions, said operational mode display controller being operably connected with the electronic display module such that, responsive to the rotational movement of the operational mode display controller amongst the plurality of rotational positions, the electronic display module is configured to display a plurality of operational modes of the machine corresponding to the plurality of rotational positions; a detent mechanism configured for providing controlled incremental rotational movement of the operational display controller about the display member into its plurality of rotational positions; an operational mode selector for controlling selection of one of the plurality of operational modes of the machine when said one of the plurality of operational modes is displayed on the electronic display module, the operational mode selector being configured for depressible movement from at least an undepressed position into a depressed position, said depressible movement being configured to actuate selection of the operational mode displayed on the electronic display module, and whereby the operational mode selector is biased into the undepressed position by a return spring such that upon movement of the operational mode selector from the undepressed position into the depressed position the operational mode selector is thereafter urged back into the undepressed position by the return spring; and a printed circuit board comprising a microcontroller module for controlling operation of the electronic display module and the machine in response to movement of the operational mode display controller and the operation mode selector; wherein the display member and the attachment member form a housing therebetween which encloses the printed circuit board, the detent mechanism and the return spring together therein to form an integrated unit in the control knob.

Preferably, the operational mode selector may comprise at least one of the (i) display member, and (ii) the operational mode display controller.

Preferably, the operational mode selector may be configured for depressible movement from at least the undepressed position into the depressed position along a movement axis extending in a substantially perpendicular direction relative to the electronic display module.

Preferably, the operational mode selector may be configured for at least one of tilting movement, pivoting movement, and sliding movement between at least the first position and the second position to actuate selection of the operational mode displayed on the electronic display module.

Preferably, the display member may include an end surface upon which the electronic display module is disposed thereon and a sidewall extending substantially perpendicularly from an edge-region of the end surface.

Preferably, the display member may include a cylindrical-shaped configuration.

Preferably, the operational mode display controller may include an annular member having a passage extending along an elongate axis thereof, said annular member being configured for surrounding the display member whereby the passage of the annular member is shaped for the display member to extend therethrough.

Preferably, the annular member may include a cylindrical-shaped sleeve having a sidewall extending in a substantially parallel orientation to the sidewall of the display member.

Preferably, the present disclosure may include a mechanism configured for vibrating the control knob in response to the operational mode selector being moved to actuate selection of an operational mode of the machine.

Preferably, the electronic display module may be configured to output at least one of a predefined colour or brightness in response to the operational mode selector being moved to actuate selection of an operational mode of the machine Preferably the control knob may include a sound emitter configured to output a predefined sound in response to the operational mode selector being moved to actuate selection of an operational mode of the machine.

Preferably, the electronic display module includes a touchscreen display and whereby the touchscreen display may be operable by a user to perform at least one of:
(a) displaying the plurality of operational modes of the machine; and
(b) selecting one of the plurality of operational modes when said one of the plurality of operational modes is displayed on the electronic display module.

Preferably, the present disclosure may include a lens cover configured for covering the electronic display module.

Preferably, the present disclosure may include a tact switch operably-connected with the microcontroller, said tact switch being configured for actuation in to an ON state when the operational mode selector is arranged in to the depressed position and whereby responsive to the actuation of tact switch in to the ON state, the microcontroller is configured for outputting a control signal for controlling operation of a function of at least one of the electronic display module and the machine;

BRIEF DESCRIPTION OF THE DRAWINGS

The present disclosure will become more fully understood from the following detailed description of a preferred but non-limiting embodiments thereof, described in connection with the accompanying drawings, wherein.

DETAILED DESCRIPTION

Figure 1A:
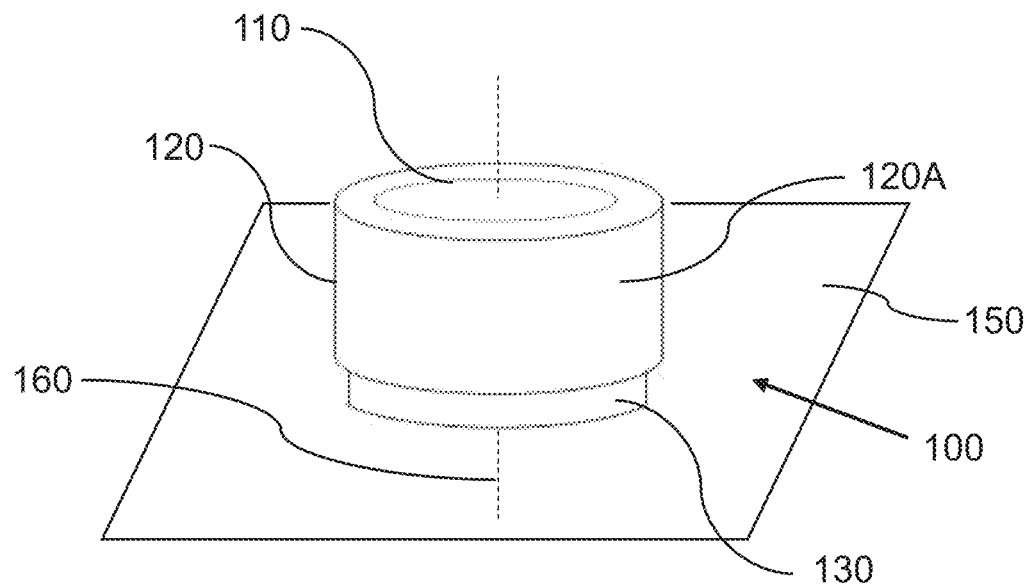
FIGS. 1A-1C depicts a perspective view of a control knob attached to a surface of a machine in sequence of operation in accordance with a first embodiment of the present disclosure.

Preferred embodiments of the present disclosure will now be described herein with reference to FIGS. 1 to 4 in the form of a control knob and control button that may, for instance, be mounted on the console of a motor vehicle and configured to control a range of vehicle systems including audio output functions from speakers, environmental functions such as air conditioning and heating, mechanical functions including for adjusting and moving mirrors, seats, sunroof, etc., and other system functions such as a security or alarm of the motor vehicle. Alternately, the control knob and control button may be mounted on the control panel of a microwave oven, washing machine or other electrical home appliance, and configured for controlling operational modes of such machines.

Referring firstly to FIGS. 1A to 1E, a first embodiment control knob (100) is shown which includes an attachment member (130) configured for attaching the control knob (100) to a control panel surface (150) of a machine (340). The attachment member (130) may for instance comprise a metal base plate having apertures disposed therein so that screws or other fastening members (130A) may pass through to effect securement of the control knob (100) to the control panel surface (150).

The control knob (100) also includes a display member (110) that is movably coupled to the attachment member (130). The display member (110) includes a cylindrical-shaped configuration having a planar end surface and an annular sidewall extending in a substantially perpendicular direction from an edge of the planar end surface towards the attachment member (130). The display member (110) may comprise any suitably rigid material such as a metal material or a rigid plastic material. The display member (110) and the attachment member (130) form a housing therebetween within which mechanical and electronic components of the control knob (100) may be housed.

An electronic display module (140) is mounted on top of the planar end surface of the display member (110) by any suitable mounting mechanism, or, may be recessed into the planar end surface so that it lies flush with the planar end surface. The electronic display module (140) may typically comprise a liquid crystal display (LCD), a thin film transistor liquid crystal display (TFT LCD), an organic light-emitting diode (OLED) display, an active matrix OLED (AMOLED) display, a backlit display, or any other suitable electronic display technology. In some embodiments, the electronic display module (140) can include a touch-sensitive technology to allow a user to "touch" displayed indicia or icons directly on the electronic display surface to navigate through possible operational mode options and/or to actuate selection of any one of the displayed operational modes. The electronic display module (140) is powered by the power supply of the machine via suitable electronic power interfacing circuitry although in alternate embodiments it may be powered by a stand-alone battery unit that may be located within the housing.

The control knob (100) further comprises an operational mode display controller (120) which may be gripped and manipulated by the user's hand in order to control the display of operational modes of the machine upon the electronic display module (140). The operational mode display controller (120) comprises a cylindrical-shaped sleeve having an annular sidewall (120B) and a passage extending along an elongate axis thereof. The cylindrical-shaped sleeve (120) is configured for attachment with the display member (110) so as to surround the display member (110) and to be rotatably movable coaxially about the display member (110) amongst a plurality of rotational positions. The passage of the cylindrically-shaped sleeve (120) is shaped to allow the display member (110) to extend through the passage and the sidewall (120B) of the cylindrical-shaped sleeve extends in a substantially parallel orientation relative to the sidewall of the display member (110). A detent mechanism may be disposed between the cylindrically-shaped sleeve (120) and the display member (110) to allow controlled incremental rotational movement of the operational mode display controller (120) about the display member (110) into its plurality of rotational positions. The step of rotating the operational mode display controller to navigate through a series of potentially selectable operational modes of the machine (340) is represented by block (400) in the flowchart of FIG. 4.

Rotational movement of the operational mode display controller (120) is sensed by a first sensor module (310) which may comprise a rotary-actuated potentiometer, an optical sensor or any other sensor device suitable for this application. For instance, the operational mode display controller could be coupled to a transducer shaft that turns with rotation of the operational mode display controller (120) and the movement of the transducer shaft could be used to actuate sensor readings by the sensor module (310). The first sensor module (310) is operably connected with a microcontroller module (330) and communicates signals to the microcontroller module (330) that are indicative of the various rotational positions of the operational mode display controller (120). The microcontroller module (330) receives the signals from the first sensor module (310) via a sensor interface and is programmed to associate the rotational position of the operational mode display controller (120) indicated by the sensor signals with actual operational modes of the machine by reference to a predetermined lookup table programmed in to the microcontroller module (330). The microcontroller module (330) is operably connected to the electronic display module (140) and transmits control signals to the electronic display module (140) to display information indicative of operational modes of the machine corresponding to the sensed rotational position of the operational mode display controller (120). The operational modes of the machine (340) may include for instance, where the machine is a washer/dryer machine, the options of either hot and cold water washing operational modes, the options of various wash times, and, the option of various dryer times. Each such option may broadly be considered as an operational mode of the machine that may be selected by the user. The step of the electronic display module (140) displaying potentially selectable operational modes of the machine corresponding to rotational positions of the operational mode display controller (120) about the display member (110) is represented by block (410) in the flowchart of FIG. 4.

Figure 1B:
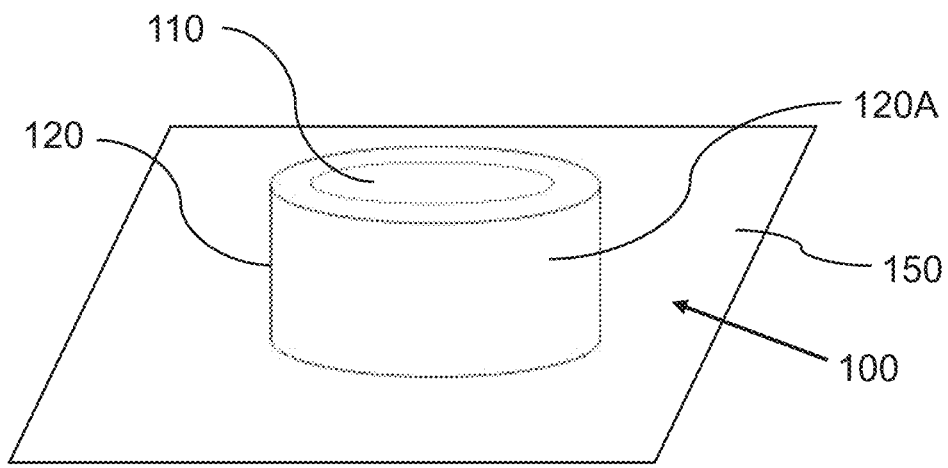

The control knob (100) includes an integrally formed operational mode selector (110, 120) which is configured for actuating the selection of one of the plurality of operational modes of the machine that is displayed on the electronic display module (140). The operational mode selector (110, 120) is configured for movement between at least a first position and a second position to actuate selection of the operational mode displayed on the electronic display module (140) at any given time. In this embodiment, the operational mode selector (110, 120) is comprised by both the display member (110) and operational mode display controller (120) which are movable together as a single actuating mechanism by the user to actuate selection of the operational mode displayed on the electronic display module (140). More particularly, in this embodiment, the operational mode selector (110, 120) is configured for depressible movement from at least an undepressed position (as shown in FIG. 1A) into a depressed position (as shown in FIG. 1B) so as to actuate selection of the operational mode displayed on the electronic display module (140).

Figure 1C:
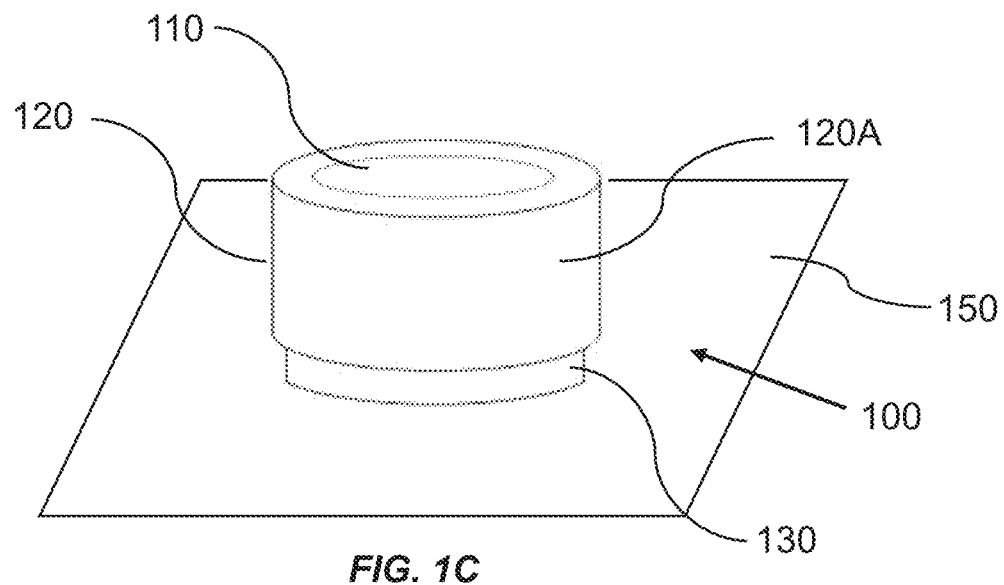
Figure 1D:
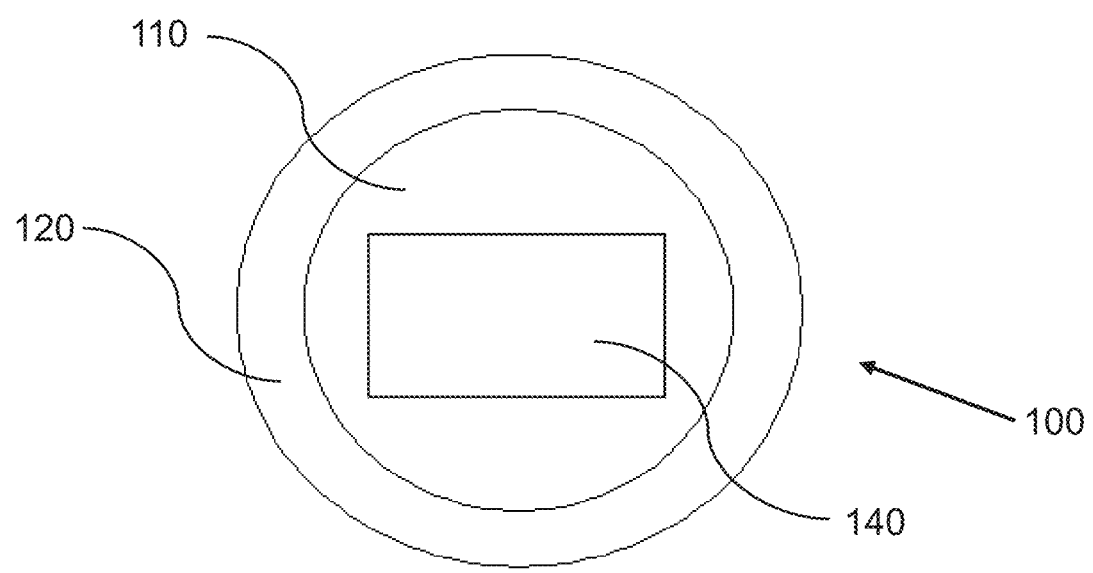
FIG. 1D depicts a top view of the control knob in accordance with the first embodiment of the present disclosure.
Figure 1E:
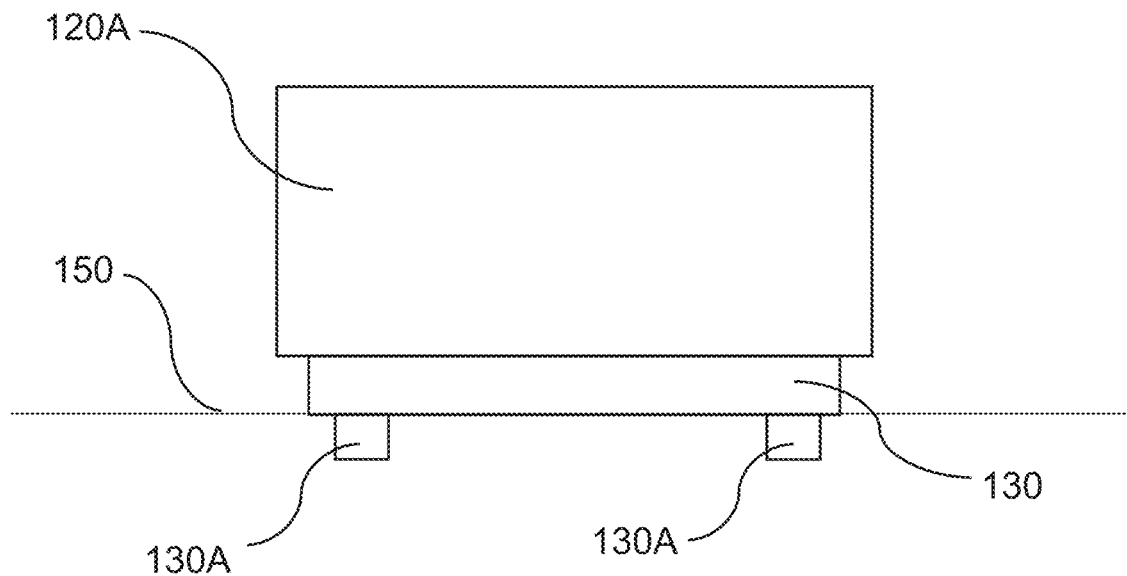
FIG. 1E depicts a side view of the control knob arranged in an undepressed position in accordance with the first embodiment of the present disclosure.
Figure 2A:
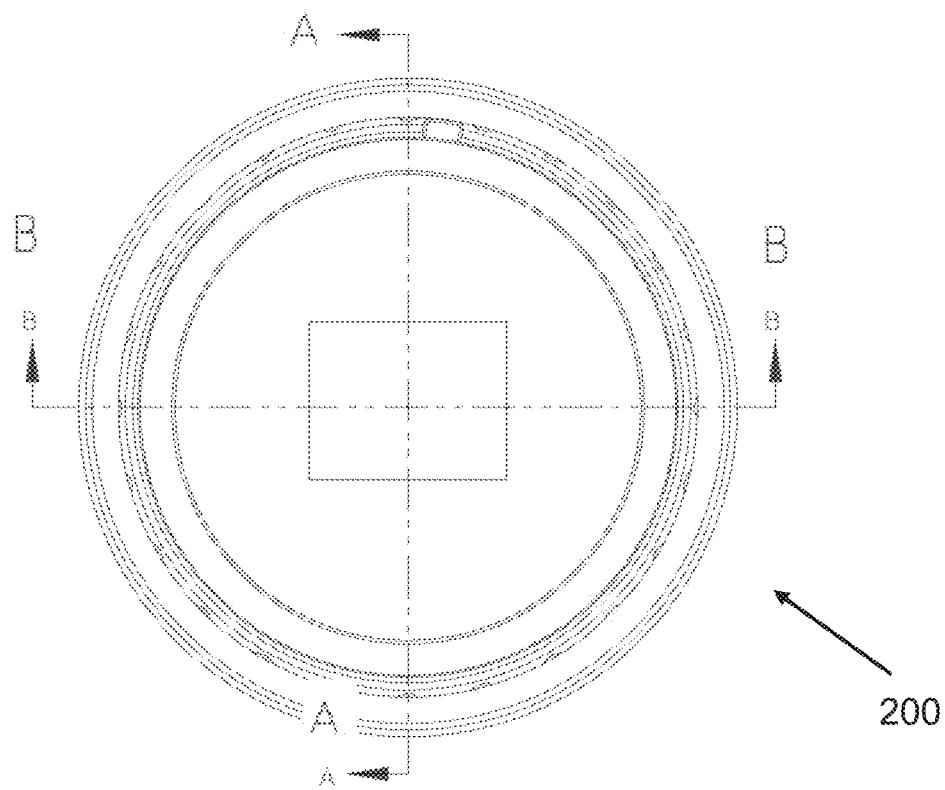
FIGS. 2A-2F depicts various views of another embodiment of the present disclosure.
Figure 2B:
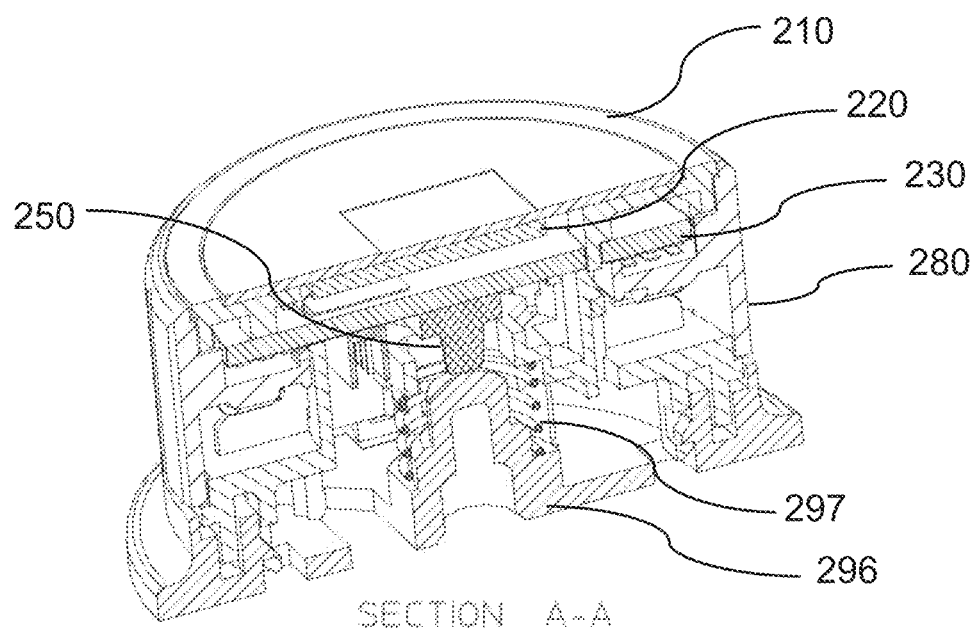
Figure 2C:
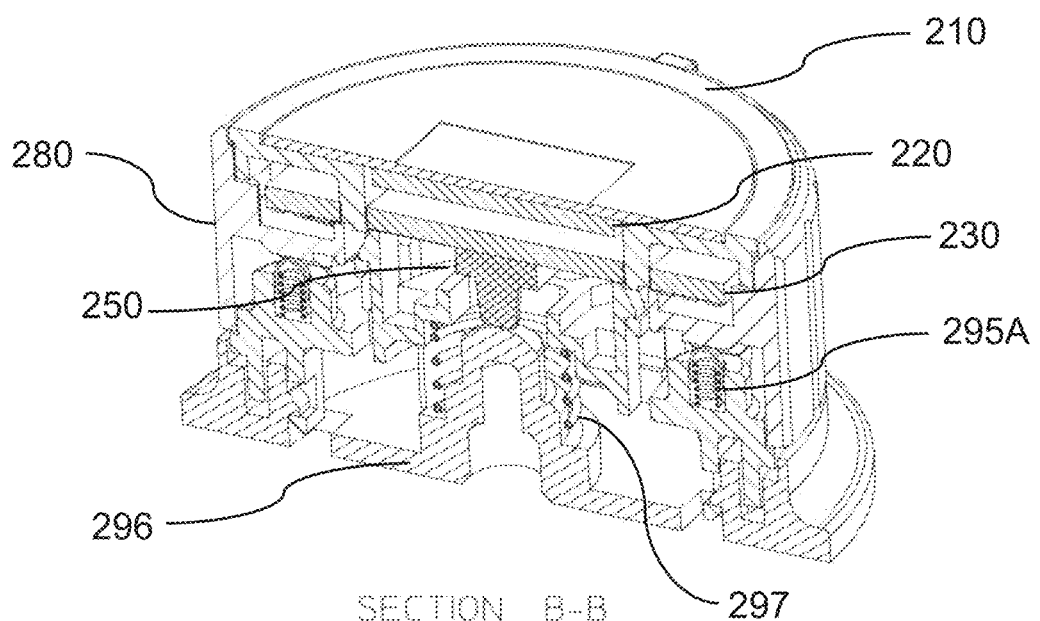
Figure 2D:
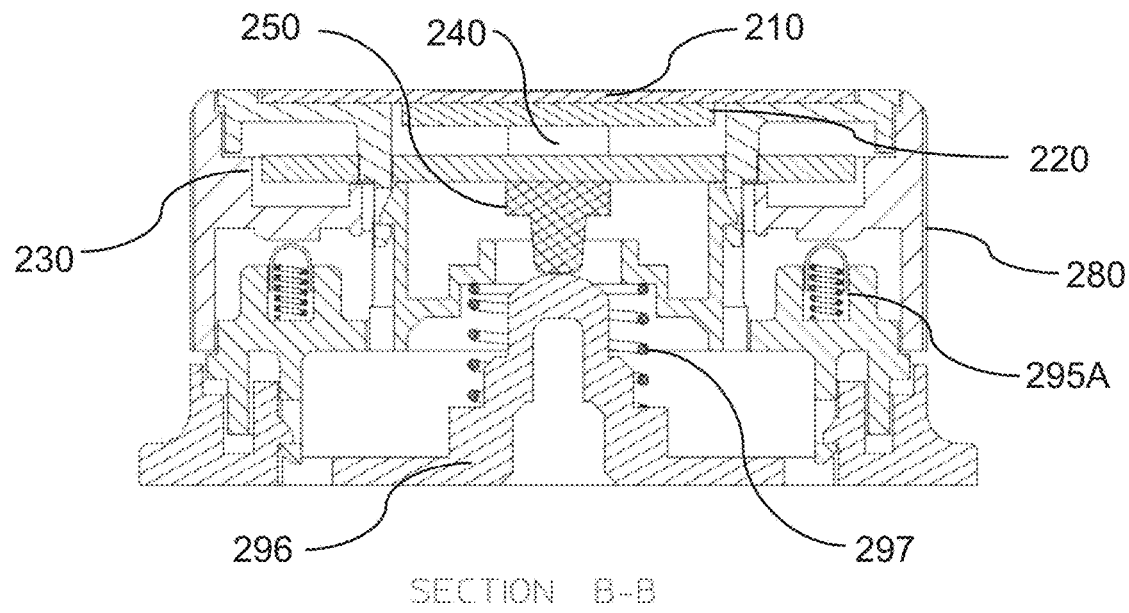
Figure 2E:
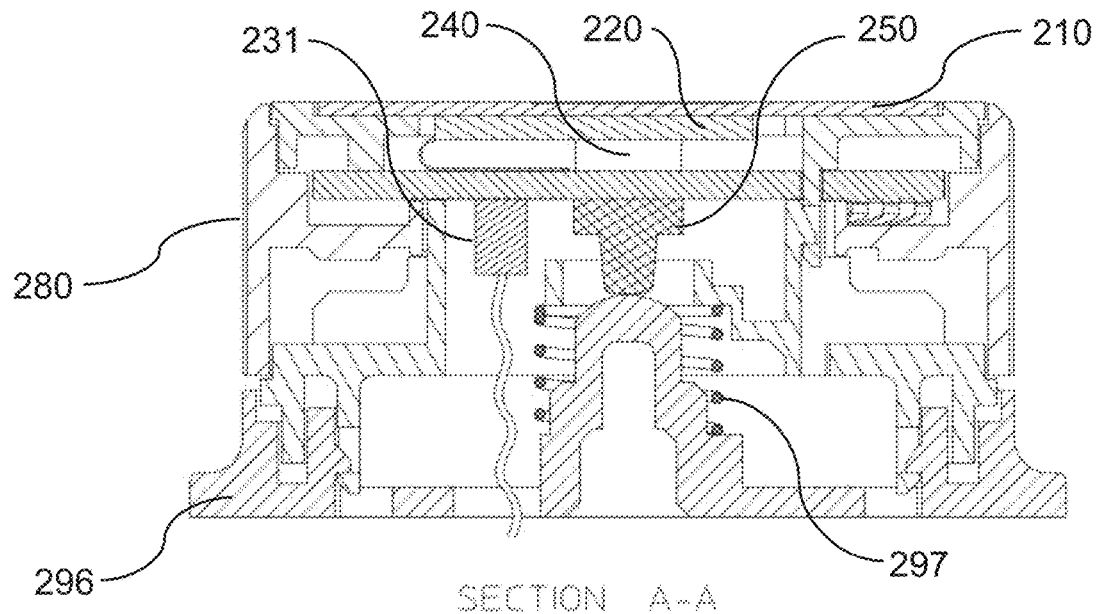
Figure 2F:
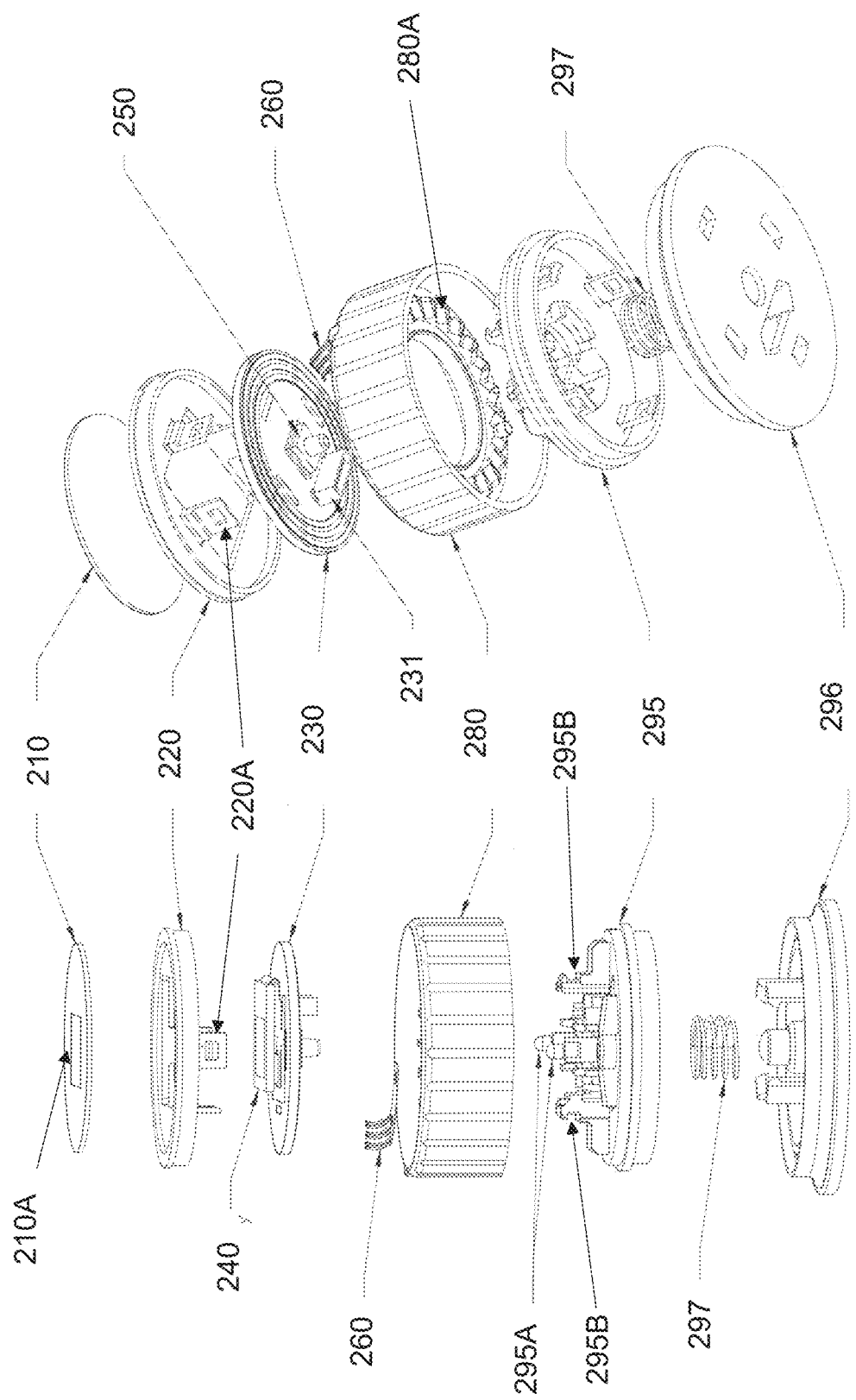
Figure 3:
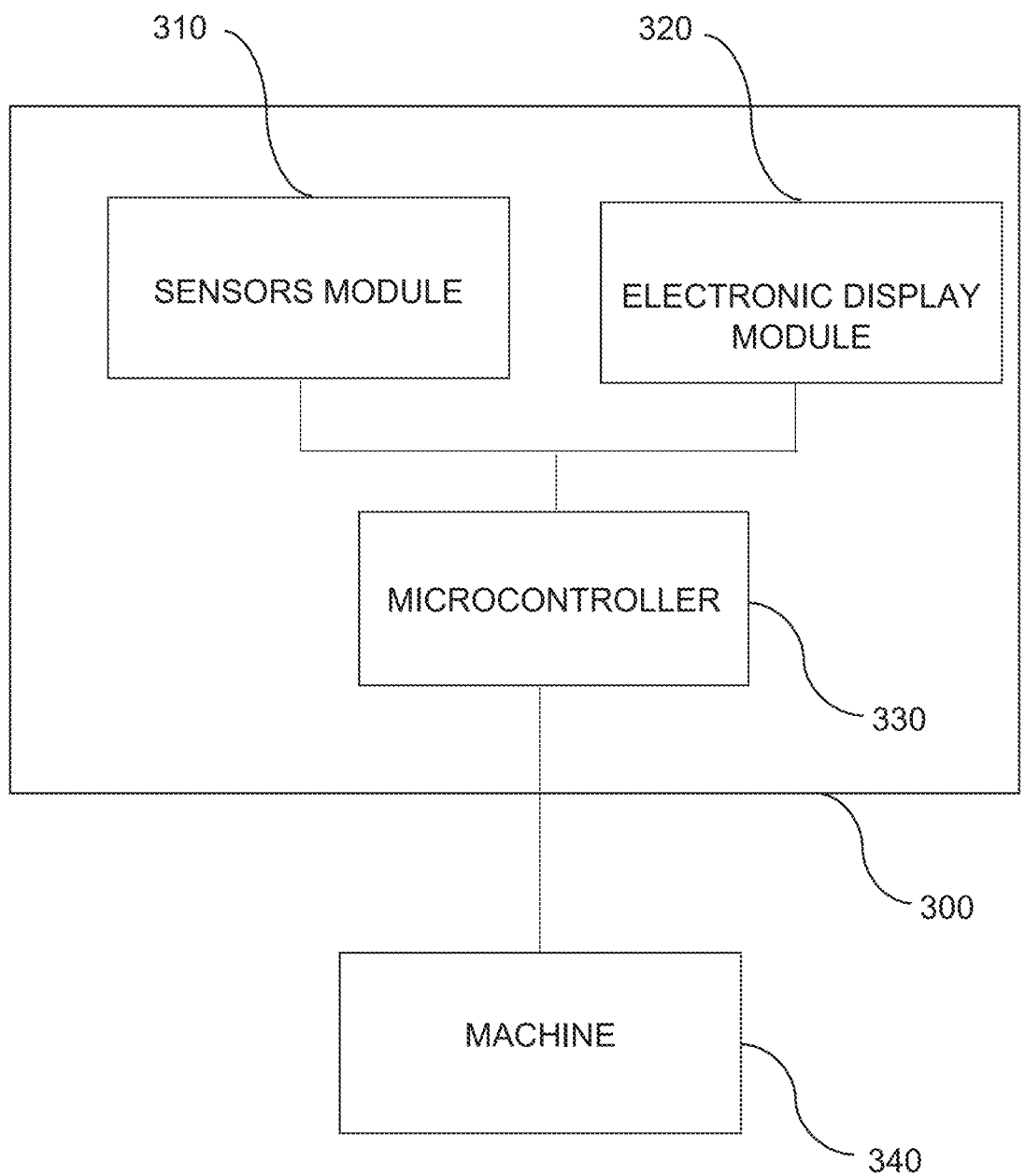
FIG. 3 depicts a functional block diagram of a control knob/button operably connected with an electrical applicant in accordance with one embodiment of the present disclosure.
Figure 4:
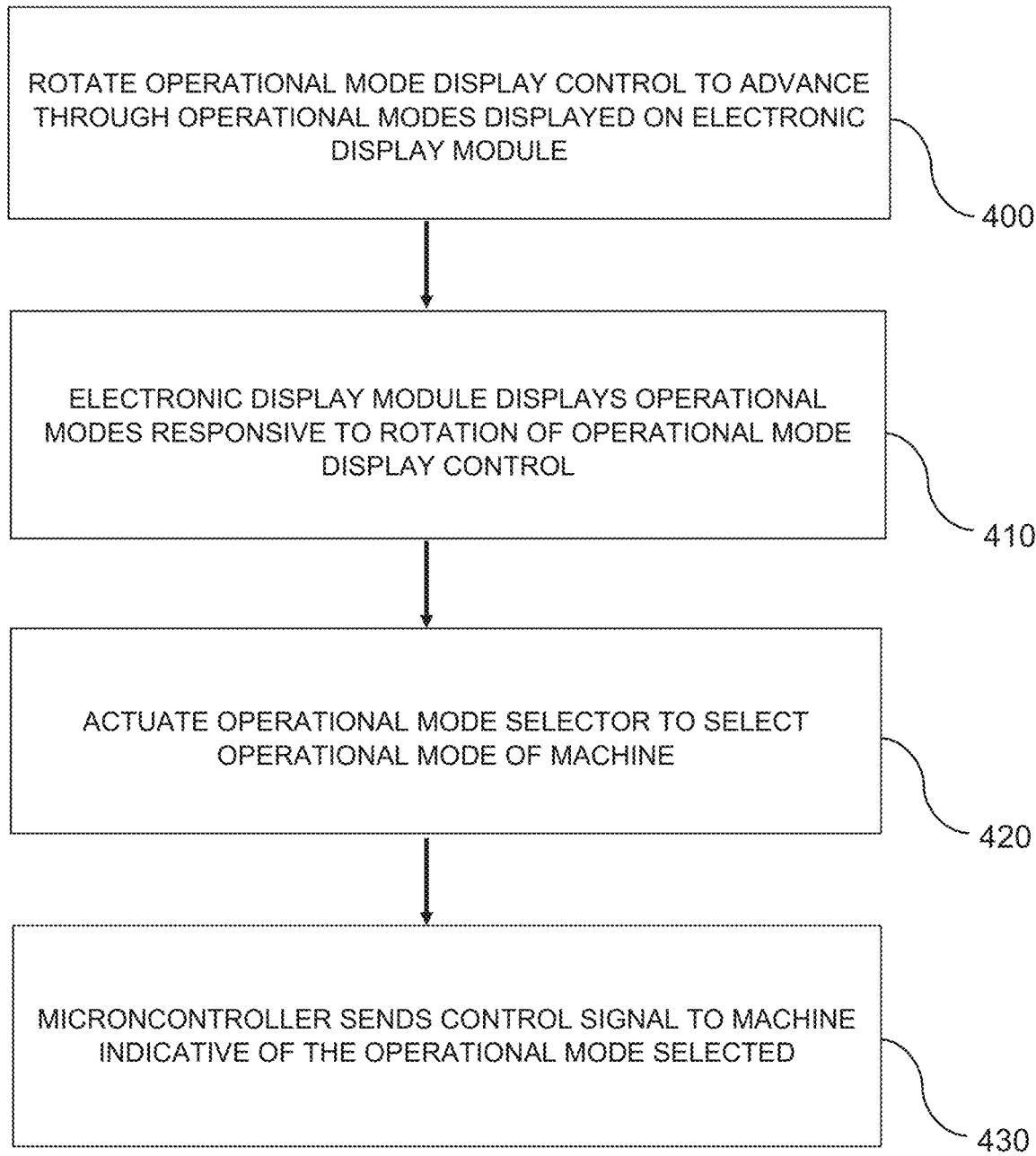
FIG. 4 depicts a flowchart of process steps for using a control knob/button in accordance with one embodiment of the present disclosure.

The operational mode selector (110, 120) is configured for depressible movement from at least the undepressed position into the depressed position along a movement axis (160) extending in a substantially perpendicular direction relative to the electronic display module (140). The operational mode selector (110, 120) is biased into the undepressed position by a return spring disposed between the display member (110) and the attachment member (130) such that upon movement of the operational mode selector (110, 120) from the undepressed position into the depressed position the operational mode selector is thereafter urged back into the undepressed position by the biasing mechanism (as depicted in FIG. 1C). In alternate embodiments of the present disclosure, the operational mode selector (110, 120) may be configured to move in other ways apart from depressible movement. For instance, the operational mode selector (110, 120) could be configured for tilting movement, pivoting movement, or sliding movement between at least the first position and the second position to actuate selection of the operational mode displayed on the electronic display module (140). In yet alternate embodiments, it is possible that the operational mode selector may comprise the operational mode display controller alone or the display member alone. The step of the operational mode selector (110, 120) actuating selection of an operational mode displayed on the electronic display module (140) is represented by block (420) in the flowchart of FIG. 4.

Movement of the operational mode selector (110, 120) is sensed by a second sensor module (310) which may also comprise a potentiometer, and optical sensor or any other sensor device suitable for this application. The sensor module (310) is operably connected with the microcontroller module (330) and communicates signals to the microcontroller module (330) indicative of the operational mode selector (110, 120) being depressed by the user. The microcontroller module (330) receives the signal from the sensor module (310) and is programmed to recognise this as being indicative of the selection of a particular operational mode being displayed on the electronic display module (140). Thereafter, the microcontroller module (330) communicates the selected operational mode externally of the control button (100) to a control module of the machine (340) either via electrical bus wiring, or, wirelessly via a wireless communication module. The step of the microcontroller module (330) sending a control signal to the machine (340) indicative of the selected operational mode is represented by block (430) in the flowchart of FIG. 4.

Referring to FIGS. 2A-2F, an alternate embodiment of the control knob (200) is provided in accordance with features of the above-described embodiment and which may additionally include one or more further features as follows. Firstly, an optical lens (210A) in a lens cover (210) may be provided for overlaying on top of the electronic display module (240) of the display member (230). The lens (210A) is seated in an outer cover (220) by snap-fitting engagement. The outer cover (220) includes a cut-out window so that the electronic display module (240) is visible through the cut-out window and through the lens cover (210). The outer cover (220) also includes protruding attachment portions (220A) that are configured to extend through receiving slots disposed in the display member (230) and in to snap-fitting engagement with corresponding protruding attachment portions (295B) extending from an inner housing plate (295) (which will be described in further detail below), so that when engaged together, the outer cover (220) and the lens (210A) are securely held in place over the electronic display module (240). Alternatively, instead of a lens, a simple transparent sheet element may be used instead to cover over the electronic display module without providing any light focussing or dispersive properties.

Additionally, the display member (230) comprises an OLED electronic display module on an upper surface whilst on a bottom surface of the display member (230), a Printed Circuit Board Assembly (PCBA) is mounted thereon which is configured for controlling operation of the electronic display module and the machine in response to signal inputs received via the operational mode display controller (280) and/or via the operational mode selector. For instance, the PCBA in this embodiment includes conductive plate of a potentiometer device that are configured to operate with a corresponding conductive wiper (260) rigidly mounted on the operational mode display controller (280). As the operational mode display controller (280) is rotated about the display member (230) the conductive wiper (260) rotates with it and depending upon the relative position of the conductive wiper (260) to the conductive plate, the potentiometer is configured to output a signal to a microcontroller module of the PCBA which in turn outputs control signals to the OLED electronic display module (240) which then outputs predetermined text of graphics based upon the potentiometer reading sensed by the microcontroller. The PCBA also includes a tact switch (250) interfaced with the microcontroller whereby as the operational mode selector is depressed by the user to effect selection of an operational mode displayed on the OLED electronic display module (240), the tact switch (250) is actuated in to an ON state. As the tact switch (250) is interfaced with an input pin of the microcontroller module, when it is switched to the ON state, a suitable signal is read by the microcontroller which results in an appropriate control signal to be transmitted by the microcontroller via wiring extending from the PDBA output connector port towards a machine-side functional module so as to control operation of the machine side functional module based on the selected operational mode. In alternate embodiments of the present disclosure, any other suitable switch device may be used in place of a tact switch. For instance, a contactless type switch which utilises optical-type sensing or magnetic-field type sensing to trigger actuation of the switch may be used.

Advantageously, the use of a contactless type switch may allow for a more compact internal structure of the control knob and may provide for greater operational lifespan of the control knob due to the switch device of the control being less susceptible to wear and tear associated with the existing art.

An annular-shaped inner housing plate (295) is disposed between the attachment member (296) and the display member (230). The inner housing plate (256) includes a pair of spring-loaded detent protrusions (295A) extending from an upper surface of the inner housing plate (295) that engage with detent recesses (280A) disposed around an inner periphery of the operational mode display controller (280) so as to provide controlled incremental rotation of the operational mode display controller (280) about the display member (230). The detent protrusions (295A) may also be configured to swivel within their respective seating members disposed on the inner housing plate (295) so as to provide for more flexible and smooth operation of the detent mechanism. A pair of protruding attachment portions (295B) also extend from the upper surface of the inner housing plate (295) which are configured for snap-fitting engagement with the protruding attachment portions (220A) extending from the outer cover (220). Conveniently, when snap-fitted together, the annular operational mode display controller (280) located between the display member (230) and the inner housing plate (295) is secured in place so as to freely rotate about the display member (230) without requiring any additional attachment parts such as screws, pins, and the like. This also provides for a simple, cost-effective and efficient method of assembling the control knob. Advantageously, as the tact switch, the PCB and the return spring are enclosed within the housing formed between the display member and the attachment member, this alleviates ingress of dust, water and other particulates which may cause damage the internal components of the control knob. In contrast, certain existing control knobs do not provide for enclosure of such components and therefore are susceptible to damage.

Furthermore, as the control knob of the present disclosure comprises a housing within which the PCB, connector ports, and tact switch are all integrally enclosed together therein, this provides for a more compact arrangement and alleviates the need for relatively extended wiring interconnections and thus alleviates risk of failure due to faulty wiring. In contrast, with certain existing control knobs, the PCB and/or other electrical components are provided externally of the control knob (for instance on the machine console) and which therefore necessitates additional complexity in manually interconnecting the control knob circuitry to the external PCB located externally of the control knob housing on the machine console. Yet further, as the control knob of this embodiment compactly integrates the PCB, tact switch, return spring and other components within the control knob housing, this allows for ease of removal for repair/replacement when the control knob.

In this embodiment, the operational mode selector comprises collectively the lens cover (210), the outer cover (220), the operational mode display controller (280), and the inner housing plate (295) which all move downwardly towards the attachment member when the control knob is depressed by the by the user's hand. When moved in to the depressed position, the tact switch is actuated in to the active mode to effect selection of an operational mode displayed on the electronic display module. In this embodiment, a return spring is located between the attachment member and a lower surface of the inner housing plate which such that upon movement of the operational mode selector from the undepressed position into the depressed position the operational mode selector is thereafter urged back into the undepressed position by the return spring. Further, the operational mode display controller and the inner housing plate have apertures disposed in them to allow the actuator rod of the tact switch to extend therethrough such that it may abut against a portion of the attachment member upon which the return spring is seated and so that the actuator rod of the tact switch is urged in to the ON position. As the portion of the attachment member upon which the return spring is seated serves a dual purpose of both locating the return spring in position, as well as providing a surface against which the tact switch may abut against in order to effect actuation during depression of the control knob, this lends itself to the formation of a relative compact and space-efficient internal structure of the control knob.

In the various embodiments described herein, the operational mode display controller and/or the operational mode selector may be further programmed for manipulation by the user to navigate through a plurality of different operational mode menus or listings. Accordingly, multi-level menus and listings of operational mode options may be displayable and selectable via a single control knob. For instance, a user may toggle between a first menu of operational mode options relating to wash cycle duration, a second menu of operational mode options relating to wash temperature modes, and a third menu of operational mode options relating to dryer time options displayable on the electronic display module. The operational mode display controller and operational mode selector may further be configured to allow the user to display and select other information such as displaying the current operational mode settings of the machine, displaying a history log of previous operational mode selections made in respect of the machine, or, suggested default operating modes may be pre-emptively displayed to the user for possible selection. The operational mode display controller and the operational mode selector may be yet further configured to allow the user to control values or magnitudes of different operational modes that are selected. By way of example, the operational mode display controller and/or the operational mode selector may be configured for manipulation by the user to incrementally increase or decrease the temperature value of a washing machine that the user has already selected to function in accordance with a hot water wash cycle, or, to incrementally increase of decrease the wash cycle time of the washing machine.

In the various embodiments described above, the electronic display module may further include a touchscreen display which may additionally be operable by a user to display the plurality of operational modes of the machine thereon, and/or, to select one of the plurality of operational modes displayed on the electronic display module.

Conveniently, as the electronic display module, the operational mode display controller and the operational mode selector are integrally formed in a single control knob/button, this provides a relatively compact configuration that lends itself well towards more efficient utilisation of control panel space on a machine without compromising ease and speed of operability by the user. The sidewall of the control knob/button display member or annular sleeve may also include a textured surface in the form of ridges, lines, bumps, or other projections extending therefrom to allow gripping by a user's hand and to provide the user with further enhanced tactile feel and control of the control knob in use. This provides a notable improvement over certain existing technologies where actuation thereof to select an operational mode does not allow for the entire control knob/button to be gripped and moved but instead may require the user to move only a portion of the control knob or button to actuate the selection. Furthermore, the control knob may further include a mechanism configured for outputting a tactile, aural and/or visual alert to the user confirming that selection of an operational mode selector has been actuated by operation of the operational mode selector. For instance, the microcontroller unit of the control knob may be configured to signal the alert mechanism to emit a sound (via a sound emitter), emit a colour lighting or brightness characteristic via the electronic display module, or vibrate.

Those skilled in the art will appreciate that the disclosure described herein is susceptible to variations and modifications other than those specifically described without departing from the scope of the disclosure. All such variations and modification which become apparent to persons skilled in the art, should be considered to fall within the spirit and scope of the disclosure as broadly hereinbefore described. It is to be understood that the disclosure includes all such variations and modifications. The disclosure also includes all of the steps and features, referred or indicated in the specification, individually or collectively, and any and all combinations of any two or more of said steps or features.

The reference to any prior art in this specification is not, and should not be taken as, an acknowledgment or any form of suggestion that that prior art forms part of the common general knowledge.

What is claimed is:

1. A control knob for controlling operation of a machine, the control knob comprising:

an attachment member configured for attaching the control knob to a surface of the machine so that the control knob is operably connectable with the machine to control operation thereof;

a display member comprising an electronic display module disposed thereon;

an operational mode display controller for controlling display of operational modes of the machine upon the electronic display module, said operational mode display controller being configured for rotational movement around the electronic display module amongst a plurality of rotational positions, said operational mode display controller being operably connected with the electronic display module such that, responsive to the rotational movement of the operational mode display controller amongst the plurality of rotational positions, the electronic display module is configured to display a plurality of operational modes of the machine corresponding to the plurality of rotational positions;

a detent mechanism configured for providing controlled incremental rotational movement of the operational display controller about the display member into its plurality of rotational positions;

an operational mode selector for controlling selection of one of the plurality of operational modes of the machine when said one of the plurality of operational modes is displayed on the electronic display module, the operational mode selector being configured for depressible movement from at least an undepressed position into a depressed position, said depressible movement being configured to actuate selection of the operational mode displayed on the electronic display module, and whereby the operational mode selector is biased into the undepressed position by a return spring such that upon movement of the operational mode selector from the undepressed position into the depressed position the operational mode selector is thereafter urged back into the undepressed position by the return spring; and a printed circuit board comprising a microcontroller module for controlling operation of the electronic display module and the machine in response to movement of the operational mode display controller and the operation mode selector;

wherein the display member and the attachment member form a housing therebetween which encloses the printed circuit board, the detent mechanism and the return spring together therein to form an integrated unit in the control knob.

2. The control knob as claimed in claim 1, wherein the operational mode selector comprises at least one of the (i) display member, and (ii) the operational mode display controller.

3. The control knob as claimed in claim 1, wherein the operational mode selector is configured for depressible movement from at least the undepressed position into the depressed position along a movement axis extending in a substantially perpendicular direction relative to the electronic display module.

4. The control knob as claimed in claim 1, wherein the operational mode selector is configured for at least one of a tilting movement, a pivoting movement, and a sliding movement between at least the first position and the second position to actuate selection of the operational mode displayed on the electronic display module.

5. The control knob as claimed in claim 1, wherein the display member includes an end surface upon which the electronic display module is disposed thereon and a sidewall extending substantially perpendicularly from an edge-region of the end surface.

6. The control knob as claimed in claim 1, wherein the display member includes a cylindrical-shaped configuration.

7. The control knob as claimed in claim 1, wherein the operational mode display controller includes an annular member having a passage extending along an elongate axis thereof, said annular member being configured for surrounding the display member whereby the passage of the annular member is shaped for the display member to extend therethrough.

8. The control knob as claimed in claim 7, wherein annular member includes a cylindrical-shaped sleeve having a sidewall extending in a substantially parallel orientation to the sidewall of the display member.

9. The control knob as claimed in claim 1, further comprising a mechanism configured for vibrating the control knob in response to the operational mode selector being moved to actuate selection of an operational mode of the machine.

10. The control knob as claimed in claim 1, wherein the electronic display module is configured to output at least one of a predefined colour or brightness in response to the operational mode selector being moved to actuate selection of an operational mode of the machine.

11. The control knob as claimed in claim 1, wherein the control knob includes a sound emitter configured to output a predefined sound in response to the operational mode selector being moved to actuate selection of an operational mode of the machine.

12. The control knob as claimed in claim 1, wherein the electronic display module includes a touchscreen display and whereby the touchscreen display is operable by a user to perform at least one of:
(a) displaying the plurality of operational modes of the machine; and
(b) selecting one of the plurality of operational modes when said one of the plurality of operational modes is displayed on the electronic display module.

13. The control knob as claimed in claim 1, further comprising a lens cover configured for covering the electronic display module.

14. The control knob as claimed in claim 1, further comprising a tact switch operably-connected with the microcontroller, said tact switch being configured for actuation in to an ON state when the operational mode selector is arranged in to the depressed position and whereby responsive to the actuation of tact switch in to the ON state, the microcontroller is configured for outputting a control signal for controlling operation of a function of at least one of the electronic display module and the machine.

15. The control knob as claimed in claim 14, wherein the tact switch is disposed on an inward-facing surface of the display member, and, the attachment member includes a shaped-portion configured for both seating the return spring thereon and for providing a surface against which the tact switch abuts when the operational mode selected is arranged in to the depressed position whereby the tact switch is able to be actuated in to the ON state.

* * * * *